3,192,194

DIAZOTHIOETHER HETEROCYCLIC COMPOUNDS

Marion Burg, Metuchen, N.J., assignor to E. I. du Pont de Nemours and Company, Wilmington, Del., a corporation of Delaware No Drawing. Filed Dec. 1, 1961, Ser. No. 156,530
2 Claims. (Cl. 260—141)

This invention relates to certain novel diazo heterocyclic compounds and photopolymerizable compositions containing such compounds. This invention also relates to image-yielding photopolymerizable elements embodying photopolymerizable components.

Various photopolymerizable compositions are known to be useful in image-yielding elements. Some of these compositions and elements are useful in image transfer processes wherein the transfer is accomplished in a wet system or where water-yielding materials are present in addition to light-sensitive materials. Improved processes result in the formation of images without the need for a water or wet system. In assignee's Burg and Cohen application Serial No. 831,700, filed August 5, 1959, now U.S. 3,060,023, for example, compositions and elements useful in a "dry" image transfer process are disclosed.

An object of this invention is to provide novel diazo heterocyclic compounds. Another object is to provide novel, improved photopolymerizable compositions. Still another object is to provide novel image-yielding photopolymerizable elements. Yet another object is to provide improved elements containing said diazo heterocyclic compounds. A further object is to provide such elements which can be polymerized by visible light sources. Still further objects will be apparent from the following description of the invention.

The novel diazothioether heterocyclic compounds of this invention are represented by the formula:

$$Y—N{=}N—S—Y'$$

wherein Y is a heterocyclic ring radical containing nitrogen selected from the group consisting of 3-pyridyl, thiazolyl, oxazolyl, selenazolyl and pyrryl, said radical being fused to the nucleus of an aryl compound selected from the group consisting of unsubstituted and substituted benzene and naphthalene, said substituents being selected from the group consisting of alkyl of 1 to 4 carbon atoms, alkoxy of 1 to 4 carbon atoms, carbalkoxy wherein the alkoxy group is of 1 to 4 carbon atoms, halogen and phenyl, and Y' is a radical selected from the group consisting of 5- and 6-member heterocyclic rings containing up to 2 hetero-atoms selected from the group consisting of nitrogen, oxygen, sulfur and selenium and from said heterocyclic rings which are fused to the nucleus of an aryl compound selected from the group consisting of unsubstituted and substituted benzene and naphthalene, said substituents being selected from the group consisting of alkyl of 1 to 4 carbon atoms, alkoxy of 1 to 4 carbon atoms, carbalkoxy wherein the alkoxy group is of 1 to 4 carbon atoms, halogen and phenyl. The preferred diazothioether heterocyclic compounds are characterized by having an extinction coefficient $\epsilon$ above 10 in at least one region of the spectrum between 380 and 700 millimicrons. Specific compounds represented by the formula include 2-(2-benzothiazolediazomercapto)benzothiazole, 2-(6-methyl-2-benzothiazolediazomercapto)-6-methylbenzothiazole, 2-(6-chloro-2-benzothiazolediazomercapto)quinoline, 2-(3-quinolinediazomercapto)benzimidazole, and 2-(2-benzothiazolediazomercapto)thiazoline.

The novel diazo heterocyclic compounds, as described above, are extremely useful in conjunction with monomeric compounds to make improved photopolymerizable compositions. The photopolymerizable compositions comprise a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization and 0.001 to 10 parts by weight per 100 parts by weight of said ethylenically unsaturated compound of said diazo heterocyclic compound. The diazo heterocyclic compound, which functions as a photoinitiator, may be used as the sole photoinitiator or in combination with other photoinitiators such as polynuclear quinones, acyloin and acyloin ethers.

In a preferred element, 0.001 to 2 parts by weight per 100 parts by weight of the total weight of components of a thermal addition polymerization inhibitor is present in the photopolymerizable compositions.

The photopolymerizable compositions are utilized in image-yielding elements comprising a support bearing a photopolymerizable stratum, said stratum having a stick temperature greater than 18° C. and comprising at least one ethylenically unsaturated compound of the type described above and a diazo photoinitiator compound as described above.

The photopolymerizable elements are particularly useful in image transfer processes conducted at room temperature or at elevated temperatures (thermal transfer) depending, of course, on the photopolymerizable composition utilized to form the stratum. Preferably the photopolymerizable composition contains a viscosity-modifying agent which can increase or decrease the viscosity of the composition to make it easier to prepare coated polymerizable elements. Viscosity-modifying agents include fillers, both inorganic and polymeric; plasticizers and high-boiling solvents. A particularly preferred agent is a thermoplastic polymeric compound solid at 50° C. which serves as a binder for the monomeric compound and diazo initiator. In order to utilize the element in room temperature transfer processes, the photopolymerizable stratum possesses a stick temperature greater than 18° C. but no greater than the temperature of the room. The photopolymerizable composition useful at room temperature comprises an ethylenically unsaturated compound containing at least one terminal ethylenic group and the initiator as previously described. The thermoplastic compound solid at 50° C. can be present in combination with an amount of a viscosity modifier, e.g., 2 to 80%, generally 2 to 50% by weight, based on the weight of the ethylenically unsaturated compound.

In order to protect all embodiments of the elements from the effects of oxygen inhibition, they preferably have placed on their photopolymerizable stratum a cover sheet such as is described in assignee's Heiart applications Serial No. 81,377, filed January 9, 1961, now U.S. 3,060,026, and Serial No. 123,651, filed July 13, 1961, and in assignee's Burg application entitled Elements and Processes, Serial No. 156,538 (now abandoned), filed even date herewith.

The photopolymerizable stratum of the above-described elements is exposed imagewise with visible and/or ultraviolet radiation, preferably visible, e.g., within the range of 380 to 700 millimicrons, so that the exposed image areas are polymerized with a subsequent increase in the stick temperature with substantially less polymerization and less increase in stick temperature in the underexposed, complementary, adjoining coplanar image areas to provide a difference of at least 10° C. in the stick temperature between said exposed and underexposed areas. By bringing the exposed stratum into intimate contact, preferably under pressure, with an image-receptive support, e.g., paper, at the operating temperature, and separating the two surfaces, an image corresponding to the underexposed image areas is transferred to the surface of the image-receptive support. By such an exposure and transfer operation, at least one copy of the original image can be obtained. Multiple copies can be obtained by repeating the transfer procedure using appropriate coating thicknesses of the stratum, pressures and temperatures to give the desired number of copies. Pressure can be applied by means well known to the art, e.g., rollers, flat or curved surfaces or platens, etc. The contact time ranges from 0.01 to 10 seconds, about 0.1 second, in general, being preferred. Shorter periods of contact are possible, however, since time is not critical.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature," as applied to either an underexposed or exposed area of a photopolymerizable stratum, means the temperature at which the image area is question sticks or adheres (transfers), within 5 seconds, under slight pressure, e.g., thumb pressure, to analytical paper (Schleicher and Schull analytical filter paper No. 595) and remains adhered in a layer of at least detectable thickness after separation on the analytical paper from the stratum. The term "operating temperature" means the temperature at which the operation of transferring the image from the photopolymerizable stratum to the image-receptive surface is actually carried out. The operating temperature is intermediate between the "stick" temperatures of the underexposed and exposed areas of a photopolymerizable stratum. The operating temperature may be at room temperature in the case of elements having a composition which is liquid or tacky at room temperature. The operating temperature may be as high as 220° C. for the thermal transfer operation.

Imagewise exposure of the photopolymerizable element requires the use of a light source rich in radiation in the visible and/or ultraviolet region of the spectrum. For the diazo initiators of this invention the exposure is preferably in the visible, e.g., between 380 and 700 millimicrons. Such light sources include ordinary tungsten lamps, fluorescent lamps, mercury arcs, carbon arcs, photoflood lamps, sunlamps, photoflash, etc. The surfaces of the exposing sources are customarily maintained at a distance of up to about 20 inches or more from the photopolymerizable layer.

Imagewise exposure in the above-described invention can be made through a stencil, line or halftone or continuous tone negative or positive or other suitable transparency and can be either by contact or projection exposure. Alternatively, reflectographic exposure techniques may also be employed. Sufficient imagewise exposure to actinic radiation is given until substantial addition polymerization takes place in the exposed areas to form an addition polymer and significantly less polymerization takes place in the underexposed areas.

The photopolymerizable compositions of the elements useful in either the room temperature or thermal transfer processes contain free-radical initiated, chain-propagating addition polymerizable ethylenically unsaturated monomeric compounds such as an alkylene or a polyalkylene glycol diacrylate prepared from an alkylene glycol of 2 to 15 carbons or a polyalkylene ether glycol of 1 to 10 ether linkages, and those disclosed in Martin and Barney, U.S. Patent 2,927,022, issued March 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur.

Outstanding are such materials wherein the ethylenically unsaturated groups, especially the vinylidene groups, are conjugated with ester or amid structures. The following specific compounds are further illustrative of this class: unsaturated esters of alcohols, preferably polyols and particularly such esters of the alphamethylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetraacrylate and tetramethacrylate, dipentaerythritol hexaacrylate, 1,3-propanediol diacrylate, 1,5-pentanediol dimethacrylate, the bis-acrylates and meth-acrylates of polyethylene glycols of molecular weight 200–1500, and the like; unsaturated amides, particularly those of the alphamethylene carboxylic acids, and especially those of alpha,omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis-(gamma-methacrylamidopropoxy)ethane beta-methacrylamidoethyl methacrylate, N-(beta-hydroxyethyl)-beta-(methacrylamido)ethyl acrylate and N,N-bis-(beta-methacrylyloxyethyl) acrylamide; vinyl esters such as divinyl succinate, divinyl adipate, divinyl phthalate, divinyl terephthalate, divinyl benezene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alphamethylene carboxylic acids and substituted carboxylic acids with polyols and polyamideswherein the molecular chain between the hydroxyls and amino groups is solely carbon or oxygen-interrupted carbon. The preferred monomeric compounds are difunctional, but monofunctional or polyfunctional monomers can also be used. The amount of monomer added varies with the particular polymers used.

The ethylenic unsaturation can be present as an extralinear substituent attached to a thermoplastic linear polymer, such as polyvinylacetate/acrylate, cellulose acetate/acrylate, cellulose acetate/methacrylate, N-acrylyloxymethylpolyamide, N-methacrylyloxymethylpolyamide, allyloxymethylpolyamide, etc., in which case the monomer and polymer function are combined in a single material.

The photopolymerizable monomers listed above which are normally solid and non-tacky at room temperature can be used when they are present in combination with viscosity modifiers which lower viscosity, e.g., plasticizers or high-boiling solvents, so that they become pressure-transferable at room temperature like the less viscous or tacky monomeric compounds. Suitable plasticizers include low molecular weight polyalkylene oxides, ethers and esters, e.g., triethylene glycol dicaprylate, polypropylene glycol mono-n-butyl ether; and other esters such as phthalates, e.g., dibutyl phthalate; adipates, e.g., diisobutyl adipate; sebacates, e.g., dimethyl sebacate. In addition, phosphates, e.g., tricresyl phosphate; amides and sulfon amides, e.g., n-ethyl-p-toluenesulfonamide; carbonates, e.g., bis(dimethylbenzyl) carbonate; citrates, e.g., triethyl citrate; glycerol esters, e.g., glycerol triacetate; laurates, e.g., n-butyl laurate; oleates, stearates, etc., are also useful.

The diazo initiator compounds within the scope of this invention are generally synthesized by converting a Y-containing amine to its diazonium salt and then coupling it with a Y'-containing mercapto compound according to the general reactions:

(1) $Y—NH_2+2HX+NaNO_2 \rightarrow YN_2X+2H_20$ (2) $YN_2X+NaS—Y' = Y—N \rightarrow N—S—Y'+NaX$ Reaction (1) above is discussed in detail in K. H. Saunders, "The Aromatic Diazo-compounds and Their Technical Applications," Edward Arnold & Co., London, England (1949), pages 2 to 20. Reaction (2) above is discussed in the Saunders reference at page 192 and in H. Zollinger, "Azo and Diazo Chemistry," Interscience Publishers, New York, New York (1961), page 150.

Suitable amines containing the Y radical include: 2-aminobenzothiazole, 2-amino-6-methylbenzothiazole, 2-amino-6-ethylbenzothiazole, 2-amino-6-methoxybenzothiazole, 2-amino-6-ethoxybenzothiazole, 2-amino-6-phenylbenzothiazole, 2-amino-6-chlorobenzothiazole, 2-amino-6-bromobenzothiazole, 2-amino-6-carbethoxybenzothiazole, 2-aminobenzselenazole, and other benzselenazoles corresponding to the above benzothiazoles, 3-aminoquinoline, 3-amino-2-methylquinoline, 3-amino-2-phenylquinoline, 2-amino-benzoxazole, 2-amino-5-chlorobenzoxazole, 3-aminoindole, and 3-amino-2-phenylindole, etc.

Examples of mercapto compounds containing the Y' radical include: 2-mercaptobenzothiazole, 2-mercapto-6-methyl-, 2-mercapto-6-phenyl-, 2-mercapto-6-ethoxy-; 2-mercaptothiazole, 2-mercapto-4-methyl-, 2-mercapto-5-phenyl-, 2-mercapto-4-phenyl-, 2-mercapto-4,5-dimethyl-; 2-mercapto-thiophene; 2-mercaptothiazoline; 2-mercaptopyridine, 4-mercapto-, 3-mercapto-, 5-mercapto-2-methoxy-, 3-mercapto-2-ethoxy-; 2-mercaptoquinoline, 3-mercapto-, 4-mercapto-, 4-mercapto-2-methyl-, 4-mercapto-2-phenyl-, 4-mercapto-2-ethoxy-; 2-mercaptooxazole; 2-mercaptoimidazole, 2-mercapto-1-methyl-, 2-mercapto-5-phenyl-, 2-mercapto-4,5-dimethyl-; 2-mercaptobenzimidazole; 2-mercaptobenzselenazole; 2-mercaptopyrazine; 2-mercapto-benzoxazole; 2-mercaptopyrimidine, 2-mercapto-5-chloro-, 2-mercapto-4,6-dimethyl-, etc.

Suitable polymerization inhibitors that can be used in photopolymerizable compositions include p-methoxyphenol, hydroquinone, and alkyl and aryl-substituted hydroquinones and quinones, tert-butylcatechol, pyrogallol, copper resinate, naphthylamnies, beta-napthol, cuprous chloride, 2,6-di-tert-butyl p-cresol, phenothiazine, pyridine, nitrobenzene, dinitrobenzene, iodine, sulfur, p-toluquinone and chloranil.

The image-yielding photopolymerizable elements are preferably made by coating or extruding a photopolymerizable composition as described above and a volatile solvent in the form of a thin film onto the surface of a suitable support to form a layer which, when dry, is from 0.00005 inch to 0.005 inch in thickness, preferably 0.0001 to 0.001 inch. Suitable support materials are stable at the operating temperatures used in the instant invention. Suitable supports include those disclosed in U.S. Patent 2,760,863, glass, wood, paper (including waxed or transparentized paper), cloth, cellulose esters, e.g. cellulose acetate, cellulose propionate, cellulose butyrate, etc., and other plastic compositions such as polyamides, polyesters, etc. The support may have in or on its surface and beneath the photopolymerizable stratum an antihalation layer as disclosed in said patent or other substrata needed to facilitate anchorage to the base. The elements can be made by procedures described in the aforesaid patent. Met extrusion, solvent extrusion, reverse roll coating and skim coating techniques can be used. Doctor knives and air doctor knives can be used to form the coatings.

The image receptive support to which the image is transferred must also be stable at the operating temperatures. The particular support used is dependent on the desired use for the transferred image and on the adhesion of the image to the base. Suitable supports include paper including bond paper, resin and clay sized paper, resin coated or impregnated paper, cardboard, metal sheets, foils and meshes, e.g., aluminum, copper, steel, bronze etc., wood, glass, nylon rubber polyethylene terephthalate; regenerated cellulose, cellulose esters, e.g., cellulose acetate; silk, cotton, viscose rayon and metal fabrics or screens.

The respective support may have a hydrophilic surface or may contain on its surface chemical compounds which react with compounds being transferred so as to produce differences in color, hydrophilicity or conducitivity between the exposed and underexposed areas or for improved adhesion or brightening of the receptive support. The image-receptive surface may be smooth, contain roughening agents such as silica, be perforated or be in the form of a mesh or screen.

In a preferred embodiment of the photopolymerizable element, a thermoplastic compound solid at 50° C. is present in the photopolymerizable composition. The thermoplastic compound is present with the monomer in amounts ranging from 3 to 97 and 97 to 3 parts by weight, respectively. Suitable viscosity-modifying agents include, e.g., (A) Copolyesters, e.g., those prepared from the reaction product of a polymethylene glycol of the formula $HO(CH_2)_nOH$, wherein $n$ is a whole number 2 to 10, inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methylacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3 polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formal;

(N) Polyformaldehydes;

(O) Polyurethanes;

(P) Polycarbonates;

(Q) Polystyrenes;

(R) Extralinear unsaturated polyamides, e.g., N-acrylyloxymethyl and N-methacrylyloxymethyl polyamides.

To the thermoplastic polymer constituent of the photopolymerizable composition there can be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamineformaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the composition, reducing tack and, in addition, as coloring agents.

Various dyes, pigments, thermographic compounds and color-forming components can be added to the photopolymerizable compositions to give varied results after the transfer step. These added materials, preferably, should not absorb excessive amounts of radiation at the exposure wave length or inhibit the polymerization reaction.

Among the dyes useful in the invention are Acid Violet RRL (CI 42425), Red Violet 5RS (CI 42690), Night Green B (CI 42115), CI Direct Yellow 9 (CI 19540), CI Acid Yellow 17 (CI 18965), CI Acid Yellow 29 (CI 18900), Tartrazine (CI 19140), Supramine Yellow G (CI 19300), Buffalo Black 10B (CI 27790), Naphthalene Black 12R (CI 20350), Safranine Bluish (CI Basic Violet 5), Auramine (CI Basic Yellow 2), Rhodamine 6GDN (CI Basic Red 1), Azosol Fast Black MA (CI Solvent Black 19), and Methylene Violet (CI Basic Violet 5).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent nonphotosensitive layer.

Useful thermographic additives, e.g., 3-cyano-4,5-dimethyl-5-hydroxy-3-pyrrolin-2-one are disclosed in Howard, U.S. Patent 2,950,987. Such compounds, in the presence of activators, e.g., copper acetate, are disclosed in assignee's Belgian Patent 588,328. Other useful thermographic additives are disclosed in the following U.S. patents: 2,625,494; 2,637,657; 2,663,654; 2,663,655; 2,663,656; and 2,663,657.

Suitable color-forming components which form colored compounds on the application of heat or when brought in contact with other color-forming components on a separate support include—

(1) Organic and inorganic components: dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) Inorganic components: ferric salts and potassium thiocyanate; ferrous salts and potassium ferricyanide; copper, mercury or silver salts and sulfide ions; lead acetate and sodium sulfide.

(3) Organic components: 2,4-dinitrophenylhydrazine and aldehydes or ketones; diazonium salt and phenol or naphthol, e.g., benzenediazonium chloride and β-naphthol; substituted aromatic aldehydes or amines and a color photographic developer compound, e.g., p-diethylaminobenzaldehyde and p-diethylaminoaniline; color photographic developer compound/active methylene compound and an oxidizing agent, e.g., p-diethylaminotoluidine/α-cyanoacetophenone and potassium persulfate.

The invention will be further illustrated by but is not intended to be limited to the following detailed procedure and examples.

PROCEDURE A

*2-(2-benzothiazolediazomercapto)benzothiazole*

Four and a half grams (0.03 mole) of 2-aminobenzothiazole in 25 ml. glacial acetic acid was diazotized at 5 to 8° C. by gradually adding 2.1 g. (0.03 mole) of sodium nitrite dissolved in 5 ml. concentrated sulfuric acid at 0° C. When addition was completed, the reaction mixture was allowed to remain at room temperature for ½ hr. and was added to a mixture of 5.0 g. (0.03 mole) of 2-mercaptobenzothiazole, 100 ml. ethanol, 50 g. of hydrated sodium acetate and 100 ml. water. The resulting yellow-orange mixture was diluted with water, filtered and the solid was air dried. A benzene soluble portion was removed by extracting with several portions of warm (50° C.) benzene. The combined benzene extracts were concentrated at room temperature to an orange red solid which was washed with a small amount of cold benzene to remove a red colored impurity. The resulting orange yellow solid was purified by dissolving in benzene and precipitating by adding low boiling petroleum ether to the turbidity point and then chilling in an ice bath. An orange yellow solid, M.P. 122–124° C. (with decomposition), was obtained, $\lambda$ max.=395 mμ, $\epsilon=1.3\times10^4$ (cyclohexane).

EXAMPLE I

Eight-tenths of a gram of "Pontacyl" Wool Blue GL (CI Acid Blue 102) was added to 80 ml. of ethanol. The mixture was brought to a boil, filtered, and the filtrate brought up to a weight of 64 g. with ethanol. Three grams of the dye solution thus prepared was added to a solution containing 13.3 g. of a polyethylene glycol diacrylate/cellulose acetate butyrate solution and 0.05 g. of the azo initiator prepared as described in Procedure A above. The diacrylate/butyrate solution was prepared by mixing at room temperature in a Waring food and beverage blender 90 g. of polyethylene glycol diacrylate, 60 g. of cellulose acetate butyrate and 350 g. of acetone. The cellulose acetate butyrate contained ca. 20.5% acetyl groups, ca. 26% butyryl and ca. 2.5% hydroxyl groups and had a viscosity of 9 to 13.5 poises as determined by ASTM method D–1343 in solution described as Formula A, ASTM method D–871–54T. The polyethylene glycol diacrylate was derived from polyethylene glycol with an average molecular weight of 300. The solution was brought up to 20 g. with acetone and coated under subdued lighting on a 0.001-inch thick polyethylene terephthalate film base and, after drying to a thickness of 0.0003 inch, a similar sheet of polyethylene terephthalate film base was laminated over the coating by pressing at room temperature with a rubber squeegee. Two samples of the coating were exposed through a transparency bearing a line image to a Macbeth 140-ampere, high carbon arc light source at a distance of 15 inches for two seconds. After exposure, the element was delaminated, was hot pressed on bond paper, and the film base bearing the adhering polymerized material was separated while still hot to leave a clear blue positive copy on the bond paper.

EXAMPLE II

A test solution consisting of 1.5 ml. of polyethylene glycol diacrylate as described in Example I to which was added 0.05 or 0.01% by weight of an azo photoinitiator set forth below was placed in a 1.5 cm. x 8 cm. Pyrex test tube and flushed with nitrogen for five minutes. Exposure was made to an air-cooled 400-watt high pressure mercury arc lamp, GE H400–R1, at a distance of eight inches with the test tube being contained in a black-lined box having a window with a Wratten 2C filter placed over it. Polymerization time was recorded as that time required for formation of a gel or polymer skin on the test tube wall. The sharp cutting Wratten 2C filter, with an optical density greater than 3.0 at wave lengths below 380 millimicrons, was effective in removing essentially all the ultraviolet radiation while passing most of the visible light. The Wratten 2C filter transmits 38% of the radiation at 400 millimicrons, 0.1% at 380 millimicrons.

| Diazo initiator: | Polymerization |
|---|---|
| 2-(2-benzothiazolediazomercapto)benzothiazole | Hard polymer in 0.3 minute. |
| Control (no initiator present) | None in 180 minutes. |

In the above examples, the abbreviations CI refers to the Colour Index, 2nd edition, The Society of Dyers and Colourists, Dean House, Picadilly, Bradford, Yorkshire, England, 1956, and The American Association of Textile Chemists and Colorists, Lowell Technological Institute, Lowell, Massachusetts, U.S.A.

As indicated above the photopolymerizable elements are useful in image transfer processes conducted at room temperature or at elevated temperatures. Such processes are useful for a variety of copying, printing, decorative and manufacturing applications. Multicopies of the process images can be obtained from the transferred image. The number of copies prepared is dependent on the photopolymerizable composition thickness as well as the process conditions. The process is also useful for preparing multicolor reproductions.

Lithographic surfaces can be produced by transferring a hydrophobic layer to a hydrophilic receptor surface or a hydrophilic layer to a hydrophobic receptor surface. The images on the lithographic surface can be made impervious to chemical or solvent attack by post-exposing the lithographic surface. Alternatively, the exposed areas of the photopolymerizable composition, after the underexposed areas are transferred, can be used as a lithographic-offset printing plate if they are hydrophobic and the original sheet support is hydrophilic or vice versa.

The transferred images are not only useful for making copies of the original image transparency by dry methods as indicated above but after transfer of the underexposed areas to a receptor support, the exposed surface can be treated with, e.g., aqueous solutions, dyes, inks, etc., to form colored images. Colored copies of the original image can be obtained when the wet surface is brought into intimate contact with a receptor support and the surfaces separated. Solvents which are used for the spirit copying, e.g., ethanol, water, should meter out the dye used and be a non-solvent for the polymer, i.e., the solubility of the dye and binder are important factors in selecting the solvent.

The exposed photopolymerized stratum can be brought into intimate contact at room temperature with a separate support, e.g., a roll of carbon or graphite; a roll coated with pigment dispersions; a roll which has a continuously replenished pigment or inked surface; a separate support coacted with pigments with or without dyes, color forming compounds, hydrophilic and hydrophobic surfaces or a metallized film. Upon removing the surfaces, the areas corresponding to the underexposed areas of the photopolymerized composition are transferred. A duplicate copy and a reverse copy are formed simultaneously.

The exposed photopolymerized surfaces are also useful with various dusting techniques, e.g., with finely divided dyes and pigments, the materials adhering in the underexposed areas. Multiple copies can be prepared. The dusted films are useful as filters, in the preparation of lithographic printing plates by using hydrophilic or hydrophobic materials, in the manufacture of printed circuits and electrically conducting or photoconductive matrices, in the preparation of two and multicolor reproductions and phosphor and ceramic patterns.

In addition to the above uses, the novel diazo initiators are useful in other processes involving development of an image, e.g., in preparing relief printing plates or offset plates wherein solvent removal of unpolymerized material might be used. Thus these elements would be useful in processes such as described in Plambeck U.S. Patent 2,760,863 and in Martin et al., U.S. Patent 2,927,022. The diazo initiators, of course, are useful in bulk, emulsion, etc., type polymerizations of the disclosed monomers.

An advantage of the diazo initiators herein employed is their relatively great solubility. The ability to work with reasonably concentrated solutions of the initiators is desirable. Another advantage of the invention is that the compositions and elements containing the diazo initiators can in many cases be exposed by visible light. Thus, the exposing light source may be simple and inexpensive, such as tungsten or fluorescent lamps. A further advantage of this invention is that many different types of image-receptive surfaces, as described previously above, can be used, i.e., any readily available uncoated paper will serve satisfactorily. Yet a further advantage is the ease of making multiple copies. Many other advantages will be apparent from the above specification.

What is claimed is:

1. An diazothioether heterocyclic compound of the formula:

$$Y{-}N{=}N{-}S{-}Y'$$

wherein Y is a heterocyclic ring radical containing nitrogen selected from the group consisting of 3-pyridyl, thiazolyl, oxazolyl, selenazolyl and pyrryl, said radical being fused to the nucleus of an aryl compound selected from the group consisting of unsubstituted and substituted benzene and naphthalene, said substituents being selected from the group consisting of alkyl of 1 to 4 carbon atoms, alkoxy of 1 to 4 carbon atoms, carbalkoxy wherein the alkoxy group is of 1 to 4 carbon atoms, halogen and phenyl, and Y′ is a radical selected from the group consisting of a 5- and 6-member heterocyclic ring containing up to 2 heteroatoms selected from the group consisting of nitrogen, oxygen, sulfur and selenium and said heterocyclic ring being fused to the nucleus of an aryl compound selected from the group consisting of unsubstituted and substituted benzene and nathalene, said substituents being selected from the group consisting of alkyl of 1 to 4 carbon atoms, alkoxy of 1 to 4 carbon atoms, carbalkoxy wherein the alkoxy group is of 1 to 4 carbon atoms, halogen and phenyl.

2. 2-(2-benzothiazolediazomercapto)benzothiazole.

References Cited by the Examiner

UNITED STATES PATENTS

| | | | |
|---|---|---|---|
| 2,540,011 | 1/51 | Reynolds et al. | 260—141 |
| 2,540,057 | 1/51 | Sprung et al. | 260—141 |
| 2,658,876 | 11/53 | Reynolds | 260—2.5 |
| 2,893,868 | 7/59 | Barney | 96—115 |
| 2,972,540 | 2/61 | Saner et al. | 96—115 |

OTHER REFERENCES

Reynolds et al.: Ind. and Eng. Chemistry, vol 42, No. 9, pages 1905–10, September 1950.

CHARLES B. PARKER, *Primary Examiner.*